United States Patent
Takehisa et al.

(10) Patent No.: US 9,588,421 B2
(45) Date of Patent: Mar. 7, 2017

(54) PELLICLE INSPECTION APPARATUS

(71) Applicant: Lasertec Corporation, Yokohama (JP)

(72) Inventors: Kiwamu Takehisa, Yokohama (JP);
Atsushi Tajima, Yokohama (JP);
Haruhiko Kusunose, Yokohama (JP)

(73) Assignee: Lasertec Corporation (JP)

( * ) Notice: Subject to any disclaimer, the term of this patent is extended or adjusted under 35 U.S.C. 154(b) by 195 days.

(21) Appl. No.: 14/683,560

(22) Filed: Apr. 10, 2015

(65) Prior Publication Data
US 2015/0293460 A1 Oct. 15, 2015

(30) Foreign Application Priority Data
Apr. 11, 2014 (JP) .................................. 2014-082284

(51) Int. Cl.
G03B 27/52 (2006.01)
G03F 1/84 (2012.01)
G03F 1/62 (2012.01)

(52) U.S. Cl.
CPC . *G03F 1/84* (2013.01); *G03F 1/62* (2013.01)

(58) Field of Classification Search
CPC ............. G03F 1/62; G03F 1/84; G03F 7/7065
See application file for complete search history.

(56) References Cited

U.S. PATENT DOCUMENTS

| | | | | |
|---|---|---|---|---|
| 4,265,545 A | * | 5/1981 | Slaker ................ | G01N 21/8901 250/559.49 |
| 4,669,875 A | * | 6/1987 | Shiba .................... | G01N 21/94 250/225 |
| 4,966,457 A | * | 10/1990 | Hayano .................. | G01N 21/94 250/559.41 |
| 5,264,912 A | * | 11/1993 | Vaught ................... | G01N 21/94 250/550 |
| 5,270,794 A | * | 12/1993 | Tsuji ..................... | G01B 11/028 356/237.4 |

(Continued)

FOREIGN PATENT DOCUMENTS

JP 2009-116284 5/2009

OTHER PUBLICATIONS

Luigi Scaccabarozzi, et al. "Investigation of EUV pellicle feasibility," SPIE vol. 8679, 867904, 2013.

*Primary Examiner* — Deoram Persaud
(74) *Attorney, Agent, or Firm* — Faegre Baker Daniels LLP

(57) ABSTRACT

Provided with a pellicle inspection apparatus that inspects a pellicle film of a mask provided with a pellicle and used in EUV lithography. The pellicle inspection apparatus includes: an illumination optical system that projects a converging illuminating beam toward the pellicle film; a light collection optical system including an object lens having an optical axis substantially orthogonal to the pellicle film and that collects scattering light outgoing from a foreign substance present on the pellicle film; and a detection system that detects the scattering light collected by the light collection optical system, wherein an incident angle θ2 of the illuminating beam with respect to the pellicle film satisfies Expression θ2−θ0>θ1+23°, where θ0 is a collecting angle (half angle) of the illuminating beam, and θ1 is a maximum light-receiving angle (half angle) of the object lens.

12 Claims, 9 Drawing Sheets

(56) References Cited

U.S. PATENT DOCUMENTS

| | | | | |
|---|---|---|---|---|
| 5,585,918 A | * | 12/1996 | Takeuchi | G01N 21/94 356/237.1 |
| 5,719,405 A | * | 2/1998 | Hayano | G01N 21/95623 250/559.41 |
| 5,963,316 A | * | 10/1999 | Miura | G01N 21/94 250/559.09 |
| 6,081,325 A | * | 6/2000 | Leslie | G01N 21/94 356/237.2 |
| 6,204,918 B1 | * | 3/2001 | Isozaki | G01N 21/8851 356/237.4 |
| 6,264,773 B1 | * | 7/2001 | Cerio | G03F 7/70983 156/152 |
| 7,619,729 B2 | * | 11/2009 | Togashi | G01N 21/9501 250/492.2 |
| 7,760,348 B2 | * | 7/2010 | Kawahara | G03F 1/84 250/559.4 |
| 8,339,568 B2 | * | 12/2012 | Maeda | G01N 21/956 355/30 |
| 2009/0104544 A1 | | 4/2009 | Kubota et al. | |
| 2009/0168191 A1 | * | 7/2009 | Takehisa | G03F 1/84 359/665 |
| 2011/0014577 A1 | * | 1/2011 | Hashimoto | G01N 21/94 430/325 |

* cited by examiner

PELLICLE INSPECTION APPARATUS

INCORPORATION BY REFERENCE

This application is based upon and claims the benefit of priority from Japanese patent application No. 2014-82284, filed on Apr. 11, 2014, the disclosure of which is incorporated herein in its entirety by reference.

BACKGROUND OF THE INVENTION

1. Field of the Invention

The present invention relates to a pellicle inspection apparatus and, more specifically, to a pellicle inspection apparatus suitable for inspecting a pellicle film on an EUV mask provided with a pellicle used in an EUVL (Extremely Ultraviolet Lithography) process.

2. Description of Related Art

Currently, ArF lithography is applied to a quantity production in a lithographic technology having a key role in miniaturization of semiconductors. In the ArF lithography, an ArF excimer laser having an exposure wavelength of 193 nm is used as an exposure source. An immersion technology for enhancing a resolution by filling a space between an object lens of an exposure apparatus and a wafer with water (referred to as "ArF immersion lithography") is also started to be used in the quantity production. In addition, in order to achieve further miniaturization, technological development aiming at commercial viability of lithography having an exposure wavelength of 13.5 nm is widely performed as a process of manufacturing next generation semiconductor device. An EUV mask has a structure in which a reflective film for reflecting EUV light is formed on a substrate formed of a low-thermal expansion glass. The reflective film generally has a multilayer film structure having molybdenum films and silicon films layered alternately by a several tens of layers, and is capable of reflecting normal incident EUV light having a wavelength of 13.5 nm as much as approximately 65%. With formation of an absorber that absorbs the EUV light on the multilayer film, blanks are formed. However, a protective film (a film referred to as a buffer layer and a capping layer) is formed between the absorber and the multilayer film. In order to actually use in exposure, a pattern is formed on a photoresist, so that the EUV mask (referred to as a EUV mask blank because the pattern is not yet formed thereon) is completed.

In the ArF lithography of the related art, a photomask provided with a pellicle for preventing foreign substances such as particles in the atmospheric air from being adhered to a pattern surface of the photomask is used. In the photomask provided with a pellicle, the pattern surface of the photomask is surrounded by a transparent thin film referred to as a pellicle film. Even when particles having sizes not larger than a certain size are adhered to the pellicle film, the particles adhered to the pellicle film exist at positions displaced in a direction of an optical axis with respect to the pattern surface. Therefore, at the time of exposure, images of the particles projected on the wafer are out of focus and hence are not exposed onto the wafer. Therefore, even though the foreign substances such as particles are suspending in the atmospheric air, the images of the foreign substances are not projected on the wafer owing to the presence of the pellicle. The pellicle is very effective as a member to achieve accurate exposure.

In contrast, the EUV light having a wavelength of 13.5 nm does not pass through the pellicle film formed of a high-polymer material for photomasks at all. Therefore, in the related art, it is considered that the pellicle cannot be provided on the EUV mask. However, it is known that silicon films and zirconium films being extremely thin having a thickness of 100 nm or smaller, transmit the EUV light to some extent. A development of the pellicle for the EUV mask using these thin films is now being performed. In particular, a monocrystalline silicon film having a thickness on the order of 50 nm is capable of transmitting approximately 90% of the EUV light. Therefore, a development of the EUV pellicle using such a silicon film is now being performed (for example, see Japanese Unexamined Patent Application Publication No. 2009-116284).

In addition, using an Si/Mo/Nb film or a polycrystalline silicon film is also reported as another type of the pellicle film (for example, see Luigi Scaccabarozzi, et al. "Investigation of EUV pellicle feasibility," SPIE Vol. 8679, 867904, 2013.). In the "Investigation of EUV pellicle feasibility", a problem of wrinkles formed on the pellicle film is also reported. In the "Investigation of EUV pellicle feasibility", as regards influence exerted on an imaging performance of the pellicle film, an extent of wrinkles formed on the pellicle film is expressed by using a ratio ($A/\Lambda$) between an amplitude $A$ and a cycle $\Lambda$. In the "Investigation of EUV pellicle feasibility", a value of $A/\Lambda$ preferably does not exceed 200 mrad, and it is reported that an amount of displacement $\Delta CDU$ of the pattern becomes 0.1 or lower if the value of $A/\Lambda$ does not exceed 200 mrad.

In the exposure process of the related art, even though the foreign substances are adhered to a surface of the pellicle film, the images of the foreign substances are not projected on the wafer. Therefore, the foreign substances inspection on the pellicle film has not been considered as an important matter. However, in the EUVL, when the foreign substances are adhered to the surface of the pellicle film, the EUV light is absorbed by the foreign substances. Therefore, a problem of errors which may occur on the pattern projected on the wafer is envisioned. Therefore, in the EUVL, conducting the foreign substance inspection on the pellicle film is strongly desired.

Examples of the effective method of inspecting foreign substances existing on the pellicle film include a laser scattering light system. In the laser scattering light system, the surface of the pellicle film is irradiated obliquely with an illuminating beam, and scattering light generated from the foreign substances is detected. As a unique problem of the EUV mask, a problem of formation of wrinkles and sagging on the pellicle film as described in the "Investigation of EUV pellicle feasibility" is pointed out. In other words, the monocrystalline silicon film is a hard thin film, and has a thickness on the order of 50 nm, which is extremely thin. If a strong tensile force is applied, the pellicle film may crack. Therefore, giving some leeway to the pellicle film is required when adhering the pellicle film on a pellicle frame. The pellicle film may be subjected to formation of wrinkles and sagging. The formation of winkles and sagging may occur in various forms. In contrast, when projecting a laser beam on the sagged pellicle film, if an amount of sagging exceeds locally a threshold value, a regular reflection light outgoing from the pellicle film enters an object lens. Therefore, a problem that an accurate foreign substance inspection cannot be performed may occur. In addition, the amount of sagging and an amount of wrinkles generating on the pellicle film are non-uniform. Depending on the form of the sagging, a problem that an amount of scattering light collected by the object lens varies may occur. In other words, depending on a direction or the form of the sagging formed on the pellicle film, a direction and an amount of scattering light outgoing from the foreign substances vary. Therefore, a problem that the intensity of the scattering light collected by the object lens varies may occur.

In addition, as a unique problem of the EUV mask, a problem of carbon contamination is pointed out. When the EUV mask is irradiated with EUV light, organic substances suspending in the vicinity of the pellicle film may be decomposed by the EUV light. Accordingly, carbide is accumulated on the surface of the pellicle film, and a thin film formed of the carbide is formed thereon. The film of the carbide formed by the carbon contamination has an effect of absorbing the EUV light. When the carbon contamination occurs, the EUV light is absorbed by the carbide film, and a problem that an accurate pattern drawing is not achieved may occur. Therefore, in the inspection of the EUV mask provided with a pellicle, capability of detecting not only the foreign substances such as particles but also contamination formed on the surface of the pellicle film in a thin film form is strongly required.

In addition, as a problem of the foreign substance inspection of the laser scattering light system, incident of inspection light onto the mask pattern through the pellicle film and generation of scattering light from the mask pattern may be exemplified. When the scattering light is generated from the mask pattern, the scattering light is received by the object lens. Consequently, sensitivity of defect detection is lowered, and a problem of generation of a pseudo defect occurs.

It is an object of the invention to realize a pellicle inspection apparatus in which problems unique to a pellicle inspection of an EUV mask is solved.

It is another object of the invention to realize a pellicle inspection apparatus capable of achieving an inspection with high degree of accuracy even though sagging or formation of wrinkles occurs on the EUV mask.

It is still another object of the invention to provide a pellicle inspection apparatus capable of detecting both foreign substances and contamination.

SUMMARY OF THE INVENTION

A first exemplary aspect of the present invention is a pellicle inspection apparatus that inspects a pellicle film of a mask provided with a pellicle and used in EUV lithography, the pellicle inspection apparatus comprising: an illumination optical system that projects a converging illuminating beam toward the pellicle film; a light collection optical system including an object lens having an optical axis substantially orthogonal to the pellicle film and that collects scattering light outgoing from a foreign substance present on the pellicle film; and a detection system that detects the scattering light collected by the light collection optical system, wherein an incident angle $\theta 2$ of the illuminating beam with respect to the pellicle film satisfies Expression (1)

$$\theta 2 - \theta 0 > \theta 1 + 23° \quad (1)$$

where $\theta 0$ is a collecting angle (half angle) of the illuminating beam, and $\theta 1$ is a maximum light-receiving angle (half angle) of the object lens.

In the EUVL process, an occurrence of sagging and formation of wrinkles on a pellicle film is inevitable. From the viewpoint of imaging performance of the exposure apparatus, an amount of sagging of a surface of the pellicle film is preferably set to be not larger than 11.5°, The reason is that when the amount of sagging exceeds 11.5°, it may exert an adverse effect on a pattern imaging performance. In the case of inspecting a pellicle film by using an inspection apparatus of a laser scattering light system, an incident angle $\theta 2$ of an illuminating beam preferably satisfies Expression (1).

$$\theta 2 - \theta 0 > \theta 1 + 23° \quad (1)$$

When the incident angle of the illuminating beam is set so as to satisfy Expression (1), even though the sagging is formed on the pellicle film, a problem of an incidence of regular reflection light from the pellicle film into an object lens is avoided. Accordingly, a pellicle inspection with high degree of accuracy can be performed.

In a preferred embodiment of the inspection apparatus according to the present invention, the illumination optical system projects a ring-shaped converging illuminating beam when viewing in a direction of an optical axis of the object lens. The sagging and formation of winkles on the EUV pellicle may occur in various modes. Therefore, there is a probability of variations in an amount of scattering light collected by the object lens by a direction of the sagging or the like when the pellicle is illuminated from only one direction. Therefore, in this example, the pellicle is scanned by using a converging illuminating beam having a ring shape. The illuminating beam having a ring shape illuminates illuminating points of the pellicle from all of the directions, even though various sagging occurs on the pellicle, an inspection in which an influence of the sagging is avoided may be conducted.

In a preferred embodiment of the inspection apparatus according to the present invention, the pellicle films formed of a silicon film, and the illuminating beam is formed of an illuminating light in an ultraviolet region, that substantially does not transmit through the silicon film. By using the illuminating light having a wavelength within an ultraviolet region, the illuminating light does not pass through the pellicle film. Therefore, occurrence of the scattering light from a mask pattern is prevented, so that the accurate pellicle inspection may be conducted. In particular, a solid-state laser generating a third harmonic wave of a YAG laser is capable of generating a compact and high output power laser beam, and generates a laser beam having a wavelength of approximately 355 nm. The laser beam having a wavelength 335 nm substantially does not pass through a silicon films, and hence may be used as an illuminating light source of the pellicle inspection apparatus effectively.

In a preferred embodiment of the inspection apparatus according to the present invention, the pellicle inspection apparatus further comprises: a light-shielding device having an opening, the light-shielding device being provided between the pellicle film and the object lens, wherein the illuminating beam is projected on the pellicle film via the opening of the light-shielding device, and the scattering light outgoing from a foreign substance present on the pellicle film enters the object lens via the opening. In the case where the pellicle inspection is conducted by using an illuminating beam within a wavelength band which transmits the pellicle, the illuminating beam transmits through the pellicle film, and incidents on the mask pattern. In this case, a problem that scattering light is generated from the mask pattern, and enters the object lens may occur. In order to solve this problem, in this example, a light-shielding device having an opening of a pin-hole shape or a slit-shape is arranged between the pellicle film and the object lens. With the provision of the light-shielding device as described above, the scattering light generating from the patterned portion of the photomask is shielded by the light-shielding device, and hence a problem that an undesirable scattering light enters the object lens is solved. In this example, since the wavelength of the illuminating light is not limited, a merit that the range of selection of the illuminating light source is increased is achieved. This example is applicable not only to the pellicle inspection on the EUV mask but also to the pellicle inspection of a photomask used for ArF lithography.

A second exemplary aspect of the present invention is a pellicle inspection apparatus that inspects a pellicle film of a mask provided with a pellicle and used in EUV lithography, the pellicle inspection apparatus comprising: an illumination optical system that projects a converging illuminating beam toward the pellicle film; a light collection optical system including an object lens having an optical axis substantially orthogonal to the pellicle film and that collects scattering light outgoing from a foreign substance present on the pellicle film; a first light detecting device that detects the scattering light collected by the light collection optical system; a second light detecting device that detects reflection light outgoing from the pellicle film; and a signal processing apparatus that detects a foreign substance defect present on the pellicle film and a contamination defect formed into a thin film shape on a surface of the pellicle film on the basis of an output signal from the first and second light detecting devices, wherein an incident angle $\theta 2$ with reference to an optical axis of the object lens with respect to the pellicle film of the illuminating beam satisfies Expression (1):

$$\theta 2 - \theta 0 > \theta 1 + 23° \quad (1)$$

where $\theta 0$ is a collecting angle (half angle) of the illuminating beam, and $\theta 1$ is a maximum light-receiving angle (half angle) of the object lens. In the EUVL process, in the case where fine particles of organic substances suspend in the vicinity of the pellicle film, the organic substances are decomposed by the EUV light. Then, carbide accumulates on the pellicle film, and a thin film-shaped contamination is formed thereon. Since this contamination absorbs the EUV light, an error of the pattern drawing is caused. Therefore, detection of not only foreign substances such as particles but also contamination is strongly required. The film-shaped contamination has a low reflectance with respect to the illuminating light, thus, detection of the contamination is achieved by detecting the intensity of the regular reflection light from the pellicle film. In the pellicle inspection apparatus of this embodiment, a scattering light inspection and regular reflection light inspection may be conducted in parallel. Therefore, both of the foreign substances such as the particles and a thin film shaped contamination may be detected only by scanning the pellicle film once by the illuminating beam.

In a preferred embodiment of the inspection apparatus according to the present invention, the signal processing apparatus includes: a first defect detecting device that detects a defect from an output signal output from the first light detecting device; a second defect detecting device that detects a defect from an output signal output from the second light detecting device; and a defect classifying device that receives output signals from the first and second defect detecting devices and classifies the detected defect into a foreign substance defect and a contamination defect, and the defect classifying device classifies the detected defect as the foreign substance defect in the case where the defect detection signals are output simultaneously from the first and second defect detecting devices, and if the defect detection signal is output only from the second defect detecting device, classifies the detected defect as the contamination defect. The film of the carbide has a low reflectance with respect to the illuminating light, detection of the contamination is achieved by detecting the intensity of the regular reflection light. However, if the scattering light is generated by the foreign substances, the intensity of the regular reflection light is also lowered. Therefore, the contamination cannot be detected only by detecting the regular reflection light. In contrast, if the scattering light is generated as characteristics of detection of the foreign substances, the intensity of the regular reflection light is also lowered. Therefore, in the case where defect detecting signals are generated from both of two defect detecting devices, it is determined that the foreign substances are present. In this manner, with the provision of a defect classifying device, defects caused by different causes of occurrence can be classified accurately.

A second exemplary aspect of the present invention is a pellicle inspection apparatus that inspects a pellicle film of a mask provided with a pellicle and used in EUV lithography, the pellicle inspection apparatus comprising: an illumination optical system that projects a converging illuminating beam toward the pellicle film at a predetermined incident angle; a light collection optical system including an object lens having an optical axis substantially orthogonal to the pellicle film and that collects scattering light outgoing from a foreign substance present on the pellicle film; a light-shielding device arranged between the pellicle film and the object lens and having an opening; a first light detecting device that detects the scattering light collected by the light collection optical system; a second light detecting device that detects regular reflection light outgoing from the pellicle film; and a signal processing apparatus that detects a foreign substance defect present on the pellicle film and a contamination defect formed into a thin film shape on a surface of the pellicle film on the basis of an output signal output from the first and second light detecting devices, wherein the illuminating beam is projected to the pellicle film via the opening of the light-shielding device, the scattering light outgoing from the foreign substance present on the pellicle film enters the object lens via the opening, and the regular reflection light outgoing from the pellicle film is received by the second light detecting device via the opening.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

Figure 1:
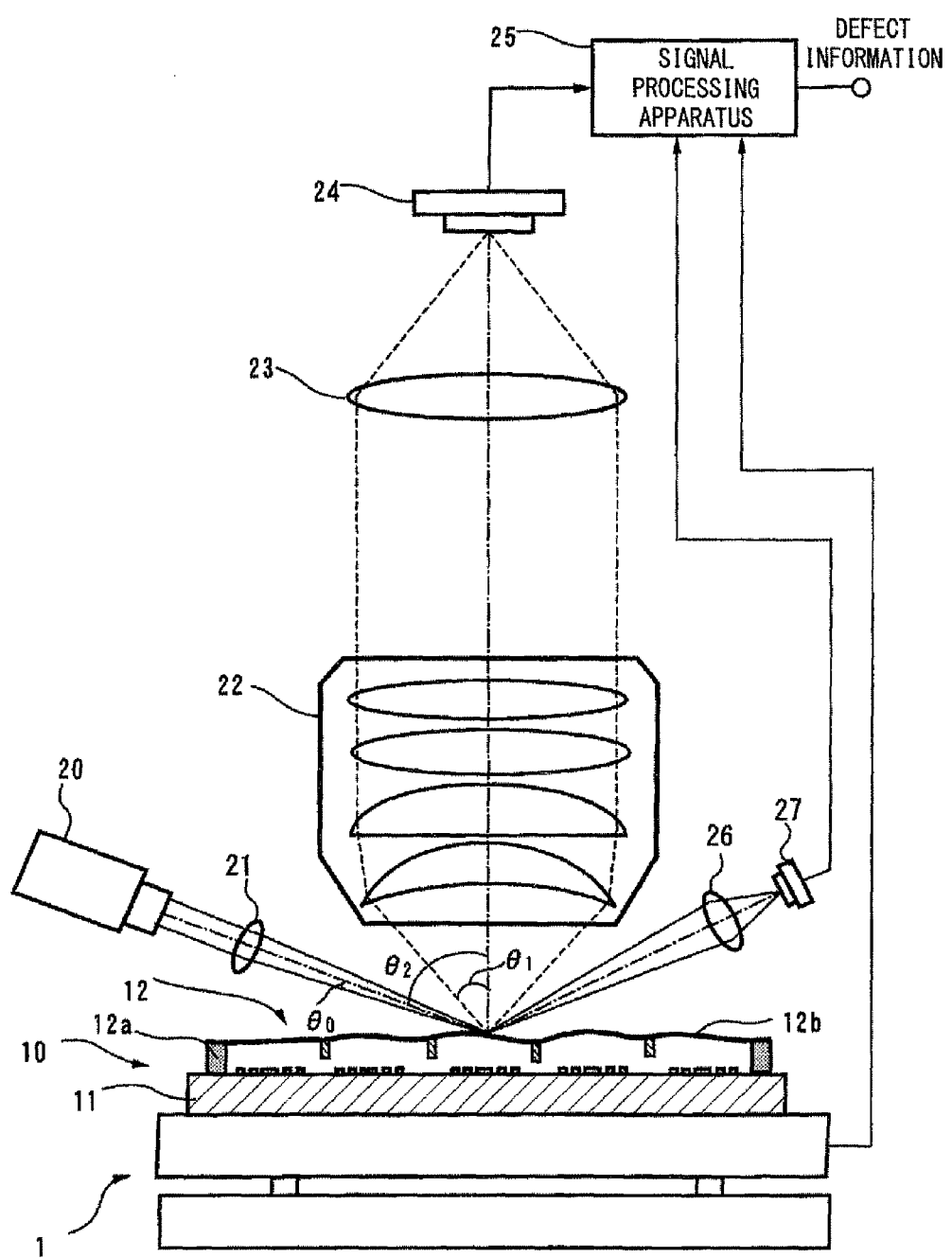
FIG. 1 is a drawing illustrating an example of a pellicle inspection apparatus of the invention.

FIG. 1 is a drawing illustrating an example of a pellicle inspection apparatus that inspects a EUV mask provided with a pellicle used in a semiconductor manufacturing process. In this example, the pellicle inspection apparatus detects foreign substances such as particles present on a pellicle film 12b of an EUV mask 10 provided with a pellicle and a contamination having a thin film form on the pellicle film 12b. The EUV mask 10 provided with a pellicle is arranged on a stage 1. The stage 1 includes an XY stage, and moves in a zigzag state in an X-direction and a Y-direction. In this example, an illuminating beam scans the pellicle film 12b two-dimensionally in association with a stage movement.

The EUV mask 10 provided with a pellicle includes an EUV mask 11 and a pellicle 12. The EUV mask 11 includes a projected pattern formed thereon. The pellicle 12 covers a patterned area of the EUV mask 11. The pellicle 12 includes a pellicle frame 12a and the pellicle film 12b. The pellicle film 12b is adhered to the pellicle frame 12a. The pellicle film 12b to be inspected includes a polycrystalline silicon film, a monocrystalline silicon film, or an Si/Mo/Nb film. In this example, an inspection is conducted on a polysilicon film having a thickness of 50 nm. The inspection may be conducted on both of a pellicle film 12b provided with a mesh-like reinforcing member and a pellicle film 12b without the reinforcing member.

The pellicle inspection apparatus of this example includes an illumination optical system that projects an illuminating beam toward a pellicle film; a light collection optical system that collects scattering light outgoing from foreign substances such as particles present on the pellicle film; a first detection system that detects collected scattering light; a second detection system that detects a regular reflection light outgoing from the pellicle film; and a signal processing apparatus that detects a foreign substance defect and a contamination defect by using output signals from the first and second detection systems.

The illumination optical system includes an illuminating light source 20 that generates an illuminating beam. As the illuminating light source 20, in this example, a solid-state laser that generates a laser beam having a wavelength of 355 nm, which is a third harmonic wave of a YAG laser, is used. The illuminating beam outgoing from the illuminating light source 20 is converted into a converging beam by a light collection lens 21, and enters the pellicle film 12b. The light collection lens 21 is included in the light collection optical system. An incident angle θ2 with respect to the pellicle film 12b of an illuminating beam is set to 60° as an example, and a half an angle of light collection θ0 thereof is set to 5°. Since a sagging is formed on the pellicle film 12b, the incident angle θ2 of an illuminating beam is assumed to be an incident angle in the case where the pellicle film 12b is assumed to be a completely flat plane.

When the illuminating beam enters the pellicle film 12b, part of the illuminating beam becomes reflected light. In the case where the pellicle film 12b has a transmissivity, part of the illuminating light transmits through the pellicle film 12b. In the case where the foreign substances are present on the pellicle film 12b, the illuminating beam illuminates the foreign substances, and scattering light is generated from the foreign substances. The scattering light is collected by an object lens 22. The scattering light collected by the object lens 22 enters a first light detector 24 via an imaging lens 23. The first light detector 24 is included in the first detection system. The output signal from the first light detector 24 is supplied to a signal processing apparatus 25 via an amplifier (not illustrated). The object lens 22 is arranged so that an optical axis thereof becomes orthogonal to the pellicle film 12b. In this example, a numerical aperture (NA) of the object lens 22 is 0.6 as an example. In this case, a maximum light-receiving angle (half an angle) of the object lens 22 is approximately 30°. Therefore, in the case where the pellicle film 12b is a completely flat film, regular reflection light outgoing from the pellicle film 12b is not received by the object lens 22. Therefore, the pellicle inspection apparatus includes a dark field illuminating system.

In contrast, the regular reflection light reflected from the pellicle film 12b is collected by a light collection lens 26, and is received by a second light detector 27. The second light detector 27 is included in a second detection system. An output signal from the second light detector 27 is supplied to the signal processing apparatus 25 via the amplifier (not illustrated). A thin film of carbide formed by a carbon contamination is a flat film. Therefore, in the case where a carbide film is formed on a surface of the pellicle film 12, no scattering light is generated. With a contamination defect having a thin film form, the first light detector 24 cannot detect the scattering light. In contrast, since the illuminating beam is absorbed by the carbide film, the intensity of a reflecting beam is lowered in intensity to be lower than an intensity of the reflecting beam from a normal portion. Therefore, by comparing the intensity of the output signal from the second light detector 27 with the intensity of the normal reflecting beam, detection of the contamination defect having a thin film form is enabled.

In the case where the illuminating light has transmissivity with respect to the pellicle film 12b, transmitted light transmitted through the pellicle film 12b enters a mask pattern, and generates scattering light. The scattering light transmits through the pellicle film 12b again, and partly enters the object lens 22. When the scattering light from the mask pattern enters the object lens 22, a problem of generation of pseudo defect occurs.

In this example, the illumination optical system and the light collection optical system are fixed, and a surface of the pellicle film 12b is two-dimensionally scanned by an illuminating beam in association with the zig-zag movement of the stage 1 in the X- and Y-directions. In this case, the position of the stage 1 is detected by a position sensor 29 (see FIG. 3), and an address of an illuminating point is supplied to the signal processing apparatus 25 as address information on the stage 1. Therefore, when the foreign substance defect and the contamination defect are detected, positional information on these defects is also detected.

Subsequently, a relationship between a maximum light-receiving angle of the object lens 22 and an incident angle of the illuminating beam will be described. In the case where an extremely thin film such as a monocrystalline silicon film or a polysilicon film having a thickness of 50 nm is used as the pellicle film 12b, sagging or formation of wrinkles occurs on the pellicle film 12b. In this case, if an amount of sagging of the pellicle film 12b is too large, a problem that the regular reflection light from the pellicle film 12b enters the object lens 22 occurs, and a problem that an imaging performance of the pattern is lowered occurs. As regards the imaging performance of the pattern, it is reported that in the case where an angle of the sagging of the pellicle film 12b is 200 mrad or smaller from viewpoints of an amplitude and a cycle of the sagging of the pellicle film 12b, putting into practical use is possible (for example, see "Investigation of EUV pellicle feasibility" described above). It is because that in the case where the angle of the sagging of the pellicle film 12b is 200 mrad or smaller, an amount of displacement ΔCDU of a pattern size projected on a wafer is 0.1 or smaller. When considering a limit of the pattern imaging performance, an upper limit of the amount of sagging of the pellicle film is set to 200 mrad. When this upper limit value of the amount of sagging is converted to an angle, it is 11.5°. On the basis of the result of analysis, in this embodiment, the incident angle of the illuminating beam with respect to the pellicle film 12b is set as Expression (1) given below.

$$\theta_2 - \theta_0 > \theta_1 + 23° \quad (1)$$

Here, θ0 is an angle of light collection of the illuminating beam, θ1 is a maximum light-receiving angle (half an angle) of the object lens 22, and θ2 is an incident angle (half an angle) of the illuminating beam. If the pellicle film 12b is inclined by 11.5°, the regular reflection light outgoing from the pellicle film 12b falls within a range from (60−11.5×2°) to (60+11.5×2°), that is, a range from 37 to 83°. In contrast, since the object lens 22 can receive only light having an incident angle of 30° or smaller, the regular reflection light from a pellicle film surface does not enter the object lens 22. In this manner, the incident angle of the illuminating light is set to be larger than the angle of NA of the object lens 22 by approximately 23° (twice an allowed angle of inclination of the pellicle film 12b) or more. In this configuration, even though the sagging occurs on the pellicle film 12, a problem that the regular reflection light outgoing from the pellicle film 12b enters the object lens 22 is resolved.

Subsequently, a wavelength of the illuminating beam will be described. When the illuminating beam transmits through the pellicle film 12b, the transmitted beam enters a pattern of the EUV mask 11, whereby scattering light scattered by the mask pattern generates. A problem that the generated scattering light transmits through the pellicle film 12b and enters the object lens 22 occurs. In order to solve such a problem, in this example, light having a wavelength that does not transmit through the pellicle film 12b is used as the illuminating light. By using the light having a low transmittance with respect to the pellicle film 12b as the illuminating light, the illuminating light does not enter a patterned portion of the EUV mask 11, and hence undesired generation of the scattering light may be effectively prevented.

Figure 2A:
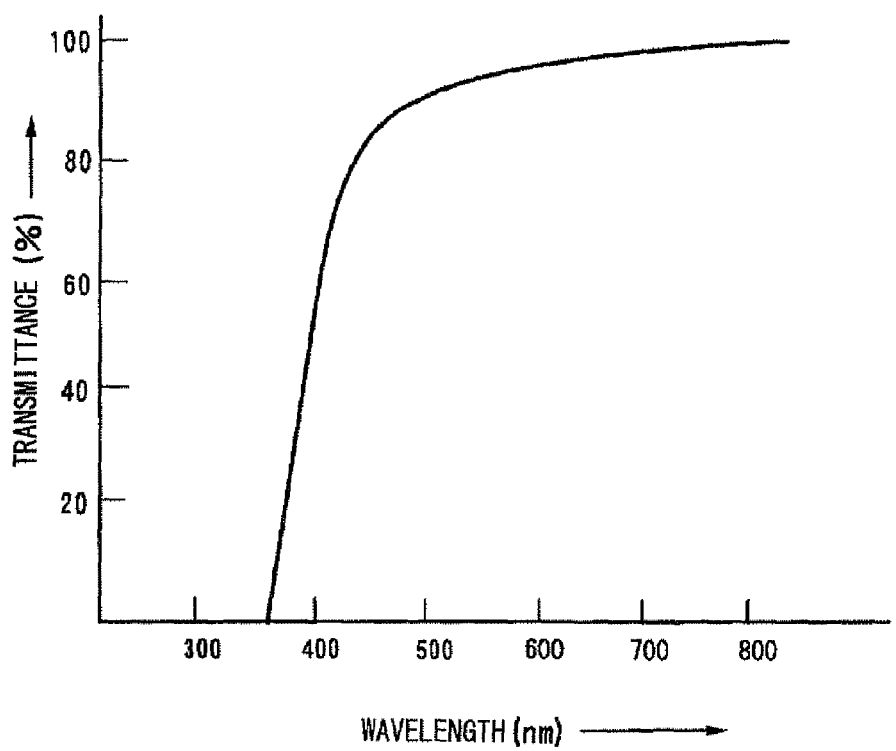
FIG. 2A is a graph showing a relationship between a wavelength and a transmittance of illuminating light of a silicon film.
Figure 2B:
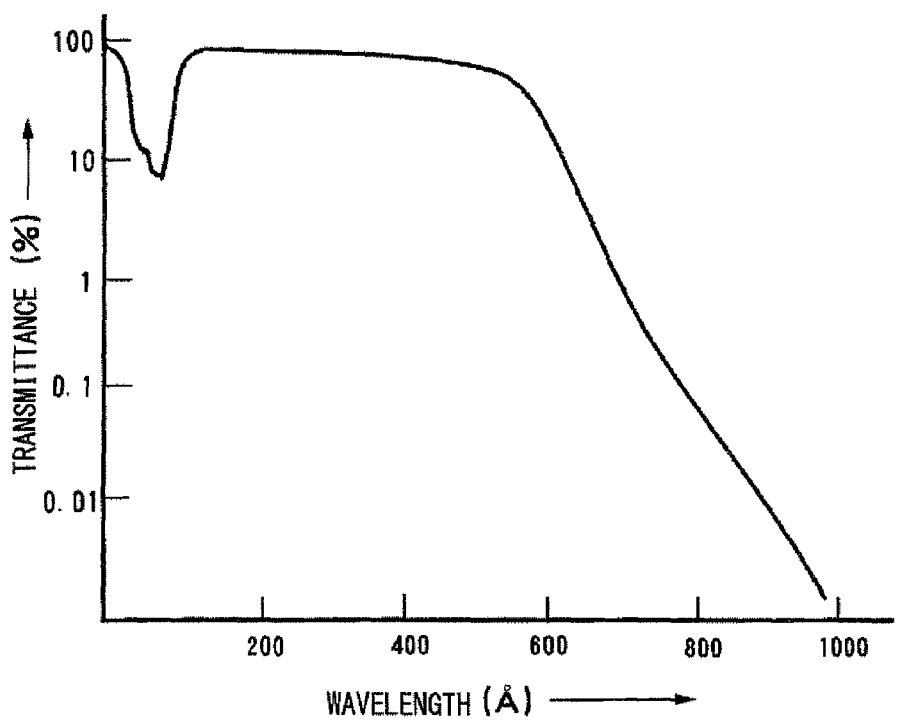
FIG. 2B is a graph showing the relationship between the wavelength and the transmittance of illuminating light of the silicon film.

FIG. 2A and FIG. 2B are graphs showing a relationship between the wavelength and the transmittance of the illuminating light of a silicon film. FIG. 2A shows a feature with respect to the silicon film having a thickness of 50 nm in a wavelength range from 200 nm upward, which is calculated from data of complex index of refraction of silicon. FIG. 2B shows a feature of the illuminating light in a wavelength range from 0 to 100 nm (1000 Å). Data shown in FIG. 2B is transmittance data of the silicon film having a thickness of approximately 0.1 μm measured by an EUV filter manufacturer. As shown in FIG. 2A, on a side of wavelengths longer than 500 nm in wavelength of the illuminating light, the transmittance exceeds 90%. In contrast, in the case where the wavelength of the illuminating light is 500 nm or shorter, the transmittance abruptly lowers and the transmittance is lowered to approximately zero in an ultraviolet region. In particular, when the wavelength of the illuminating light is reduced to approximately 360 nm or shorter, the transmittance becomes approximately zero. When the wavelength is further reduced to approximately 60 nm (600 Å) or shorter, the transmittance is increased again, and is increased to approximately 90% at a wavelength of 13.5 nm (see FIG. 2B). Considering the transmittance features of the silicon film, in this example, the illuminating light in the ultraviolet region is preferably used. In this case, the solid-state laser that generates a harmonic wave of three times the YAG laser is quite suitable as the illuminating light source 20 because it generates a laser beam having a wavelength of 355 nm. In particular, the solid-state laser is quite effective because a compact and high-output power laser beam may be generated. Various light sources other than the laser light sources which generate laser light having a wavelength of 355 nm may be used and, for example, a HeCd laser that generates a laser beam having a wavelength of 325 nm can be used.

Subsequently, detection of the carbon contamination by the second detection system will be described. As described above, in the case where the EUV mask 11 is irradiated with the EUV light, organic substances suspending in the vicinity of the pellicle film 12b is decomposed by the EUV light, and carbide is accumulated on the surface of the pellicle film. The carbon contamination, which is a thin film of carbide, is formed. As a result that the present inventors conducted various experiments and analyses on the carbon contamination, the following points were found. Firstly, since a surface of the carbide film is a flat surface, little scattering light is generated even though the illuminating beam is projected. Therefore, with the laser scattering light system, the contamination cannot be detected unlike the foreign substance inspection such as the inspection of particles. Secondly, the reflectance of the carbide film is significantly smaller than the reflectance of the silicon film. Therefore, when the illuminating beam enters the portion in which the carbon contamination is formed, the intensity of the regular reflection light is significantly reduced. Therefore, the second light detector 27 detects the regular reflection light from the pellicle film 12b. The signal processing apparatus 25 compares the intensity of the detected regular reflection light with the intensity of the reflected light from the normal portion of the pellicle film 12b. In this manner, the carbon contamination may be detected. On the basis of the result of study, the second detection system detects the regular reflection light from the pellicle film 12b, and the signal processing apparatus 25 performs a threshold value comparing process to detect the contamination.

Figure 3:
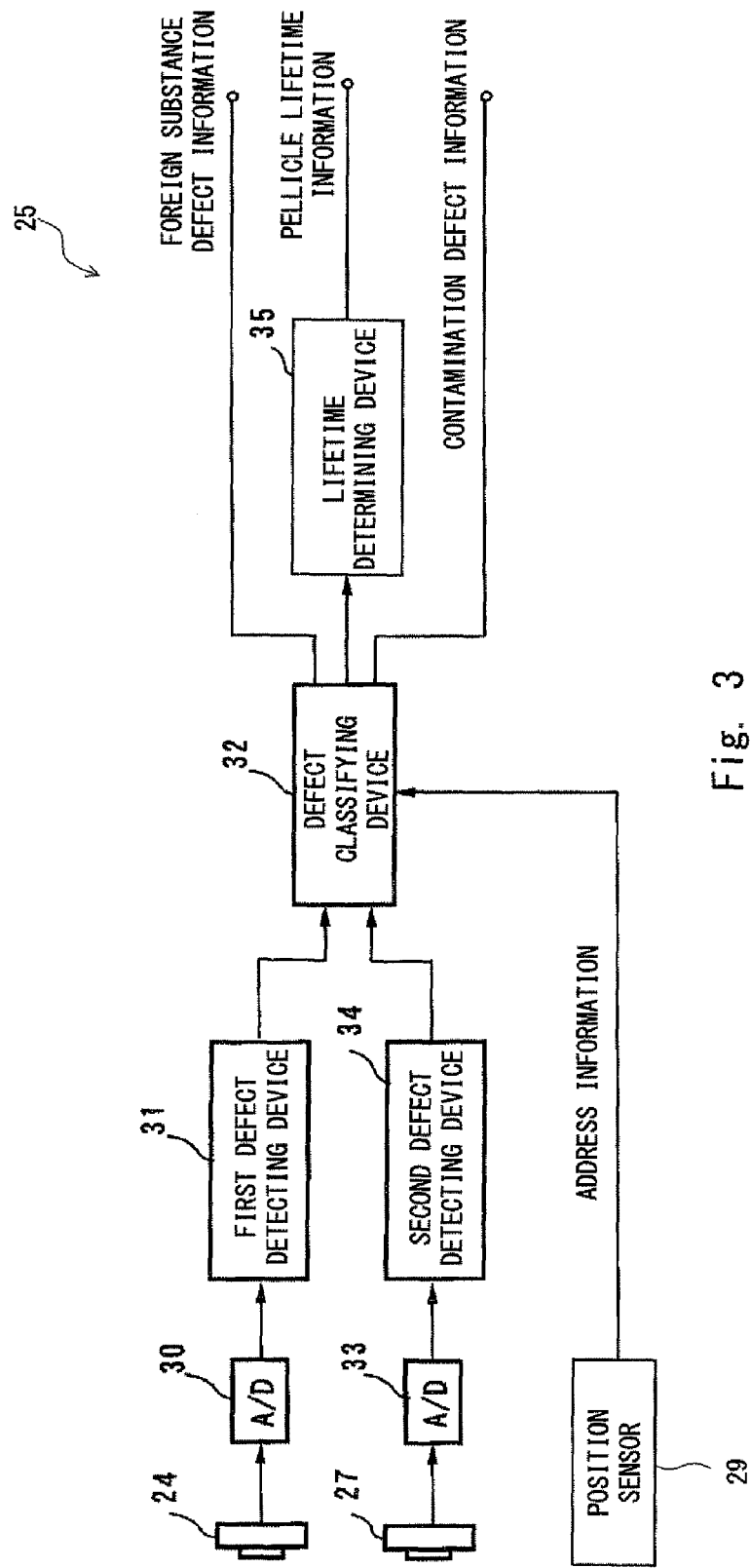
FIG. 3 is a drawing illustrating an example of a signal processing apparatus.

FIG. 3 is a drawing illustrating an example of the signal processing apparatus 25 that detects the foreign substances and the contamination. An output signal from the first light detector 24 that detects the scattering light is supplied to a first defect detecting device 31 via an A/D converter 30. The first defect detecting device 31 includes a comparator. The first defect detecting device 31 compares the intensity of the output signal from the first light detector 24 with a threshold value. In the case where the intensity of the output signal exceeds a predetermined threshold value, that is, in the case where the scattering light having the intensity exceeding a predetermined level is detected, the first defect detecting device 31 generates a defect detection signal and supplies the defect detection signal to a defect classifying device 32.

An output signal from the second light detector 27 that detects the regular reflection light from the pellicle film 12b is supplied to a second defect detecting device 34 via an A/D converter 33. The second defect detecting device 34 also includes a comparator, and compares the intensity of the output signal from the second light detector 27 with a threshold value. In the case where the intensity of the output signal is lower than a predetermined threshold value, that is, in the case where the regular reflection light having the intensity not higher than a predetermined level is detected, the second defect detecting device 34 generates a defect detecting signal and supplies the defect detecting signal to the defect classifying device 32.

The defect classifying device 32 uses the defect detection signals from the first defect detecting device 31 and the second defect detecting device 34 to classify the foreign substances such as particles and the contamination having a thin film form. In the case where foreign substances are present on the pellicle film 12b, scattering light is generated from the foreign substances. Therefore, the foreign substance defect is detected by the defect detection signal output from the first defect detecting device 31. In the case where the contamination defect is present, the intensity of the regular reflection light is lowered, and hence the contamination defect is detected by the defect detection signal output from the second defect detecting device 34. However, in the case where the foreign substances are detected, part of the illuminating light becomes scattering light. Therefore, the intensity of the regular reflection light is lowered, and the defect detection signal is generated also from the second defect detecting device 34. Therefore, in the case where only the defect detection signal output from the second defect detecting device 34 is used for determination, a problem that the foreign substances are confused with the contamination as being detected simultaneously may occur. In order to solve such a problem, the signal processing apparatus 25 is provided with the defect classifying device 32 in this example. In the case where the defect detection signals are supplied simultaneously from both of the first defect detecting device 31 and the second defect detecting device 34, the defect classifying device 32 classifies the defect detection signals as signals indicating the foreign substance defect. In the case where no defect detection signal is input from the first defect detecting device and only a defect detection signal from the second defect detecting device 34 is input, the defect classifying device 32 determines that the defect detection signal is a defect detection signal generated due to the contamination defect. In this manner, if the defect classifying device 32 is provided, the foreign substances and the contamination can be separated.

Address information output from the position sensor 29 (see FIG. 3) that detects the position of the stage 1 is input to the defect classifying device 32. The defect classifying device 32 is capable of outputting information indicating the presence of the detected foreign substance defect and contamination defect and the addresses thereof by using the address information supplied from the position sensor 29. In this example, it is determined to be the foreign substance defect in the case where the defect detection signals are generated simultaneously from the first defect detecting device 31 and the second defect detecting device 34. However, determination by using the address information on the detected defect is also possible. For example, a configuration in which if the defect detection signals generated from the first defect detecting device 31 and the second defect detecting device 34 have the same address, it is determined to be the foreign substances, and if the addresses are different, it is determined as the contamination is also applicable.

In addition, the output from the defect classifying device 32 is supplied to a lifetime determining device 35. The lifetime determining device 35 calculates the number of the detected foreign substances and contaminations. The lifetime determining device 35 determines the lifetime of the pellicle by comparing the number of the foreign substances and the contaminations with a predetermined threshold value. In other words, as the number of times of exposure increases, the amounts of generation of the foreign substances and the contamination formed on the pellicle film 12b increase correspondingly. When these amounts exceed a predetermined amount, a pattern drawing error may easily occur. Therefore, the lifetime of the pellicle 12 can be determined by comparing the number of detected defects with a predetermined threshold value. Accordingly, in this embodiment, the lifetime determining device 35 counts the number of detected defects, and outputs as pellicle lifetime information. In other words, a relationship between the number of defects present on the pellicle film 12b and a rate of occurrence of the pattern drawing error is obtained in advance. The lifetime determining device 35 outputs the lifetime information when the number of detected defects exceeds the predetermined number. The lifetime of the pellicle 12 can be classified in several levels and output as the lifetime level information. By using the pellicle lifetime information as described above, time for replacement of the pellicle 12 can be determined adequately.

Figure 4A:
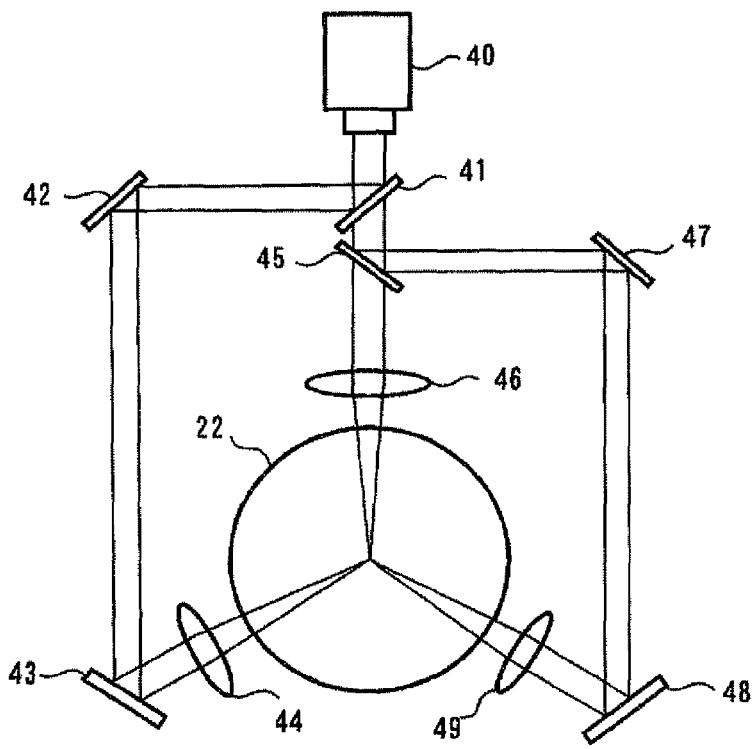
FIG. 4A is a drawing illustrating a modification of an illumination optical system.
Figure 4B:
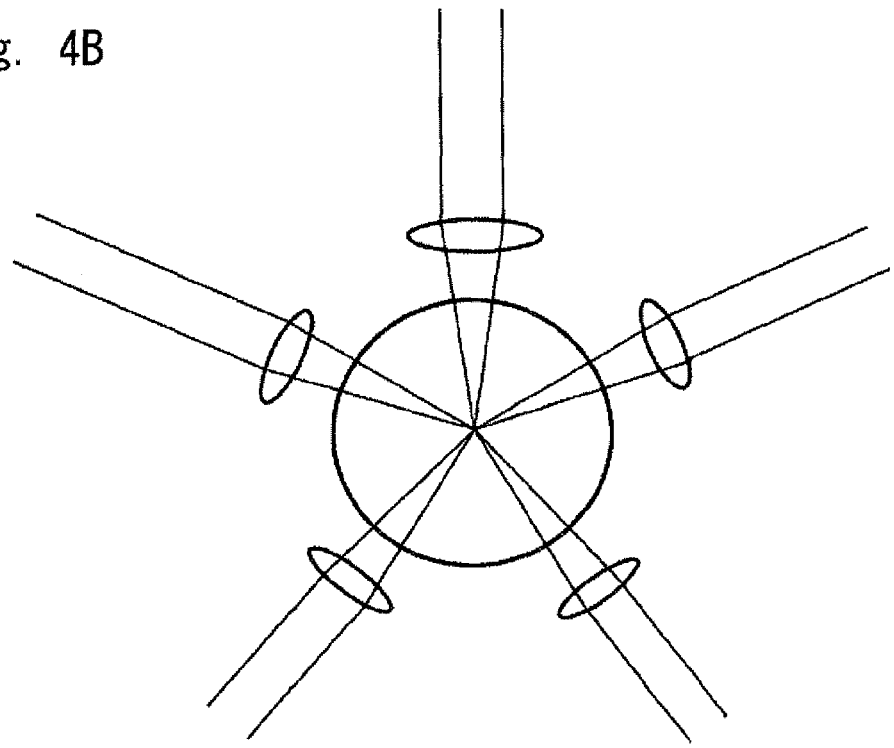
FIG. 4B is a drawing illustrating a modification of the illumination optical system.

FIG. 4A and FIG. 4B are drawings illustrating a modification of the illumination optical system of this embodiment. In the EUV pellicle, the inclination of the pellicle film surface irradiated with the illuminating light varies depending on the place in the pellicle film surface. Therefore, even though the size and the type of the foreign substances are the same, a distribution of angle of the generated scattering light varies depending on the position in the pellicle film. Therefore, a problem that the amount of light collected by the object lens 22 varies depending on the positions of the foreign substances in the pellicle film surface occurs. In order to solve such a problem, in this example, the pellicle film is illuminated from a plurality of angular directions, and the problem caused by a change of an inclination angle of the pellicle film is solved. In other words, if the pellicle film is illuminated from the plurality of angular directions, the particles on the pellicle film are illuminated from the various angular directions. Therefore, intensities of the scattering light generated from the foreign substances may be uniformized.

The illumination optical system illustrated in FIG. 4A illuminates the pellicle film by three illuminating beams arranged in an annular shape at regular intervals (120°) about an illuminating point on the pellicle film. Referring to FIG. 4A, an illumination light source 40 generates a parallel illuminating beam. The illuminating beam from the illumination light source 40 is divided into a reflecting beam and a transmitted beam by a first beam splitter 41. A rate of transmission and reflection of the first beam splitter 41 is set to 2:1. The reflecting beam reflected from the first beam splitter 41 is reflected by total reflection mirrors 42 and 43. The reflecting beam reflected from the total reflection mirror 43 is collected by a first light collection lens 44, and illuminates the illuminating point as the converging illuminating beam. The transmitted beam transmitted through the first beam splitter 41 enters a second beam splitter 45, and is divided into the reflecting beam and the transmitted beam. A rate of transmission and reflection of the second beam splitter 45 is set to 1:1. The transmitted beam outgoing from the second beam splitter 45 is collected by a second light collection lens 46, and illuminates the illuminating point.

The reflecting beam outgoing from the second beam splitter 45 is reflected by third and fourth total reflection mirrors 47 and 48. A reflecting beam reflected from the total reflection mirror 48 is collected by a third light collection lens 49, and illuminates the illuminating point as the converging beam. Three of the converging illuminating beams illuminate the same illuminating point. This example is characterized in that the total sum of the amounts of light of the scattering light from the foreign substances generated by the three illuminating beams respectively are almost constant even though the pellicle film surface is inclined in some degree. Therefore, if the foreign substances are the same, detection is achieved at the same sensitivity regardless of the positions in the pellicle film surface. In this manner, by illuminating from various angular directions by using a plurality of the illuminating beams, a problem caused by a change in angle of inclination of the pellicle film is solved.

FIG. 4B illustrates an example of illumination by five of the illuminating beams arranged at regular intervals about the illuminating point on the pellicle film 12b. In this manner, the number of the illuminating beams may be five. In this case, variations in total sum of the amounts of scattering light from the foreign substances in the case where the pellicle has an inclination are reduced more, and unevenness of the sensitivity is further reduced.

Figure 5:
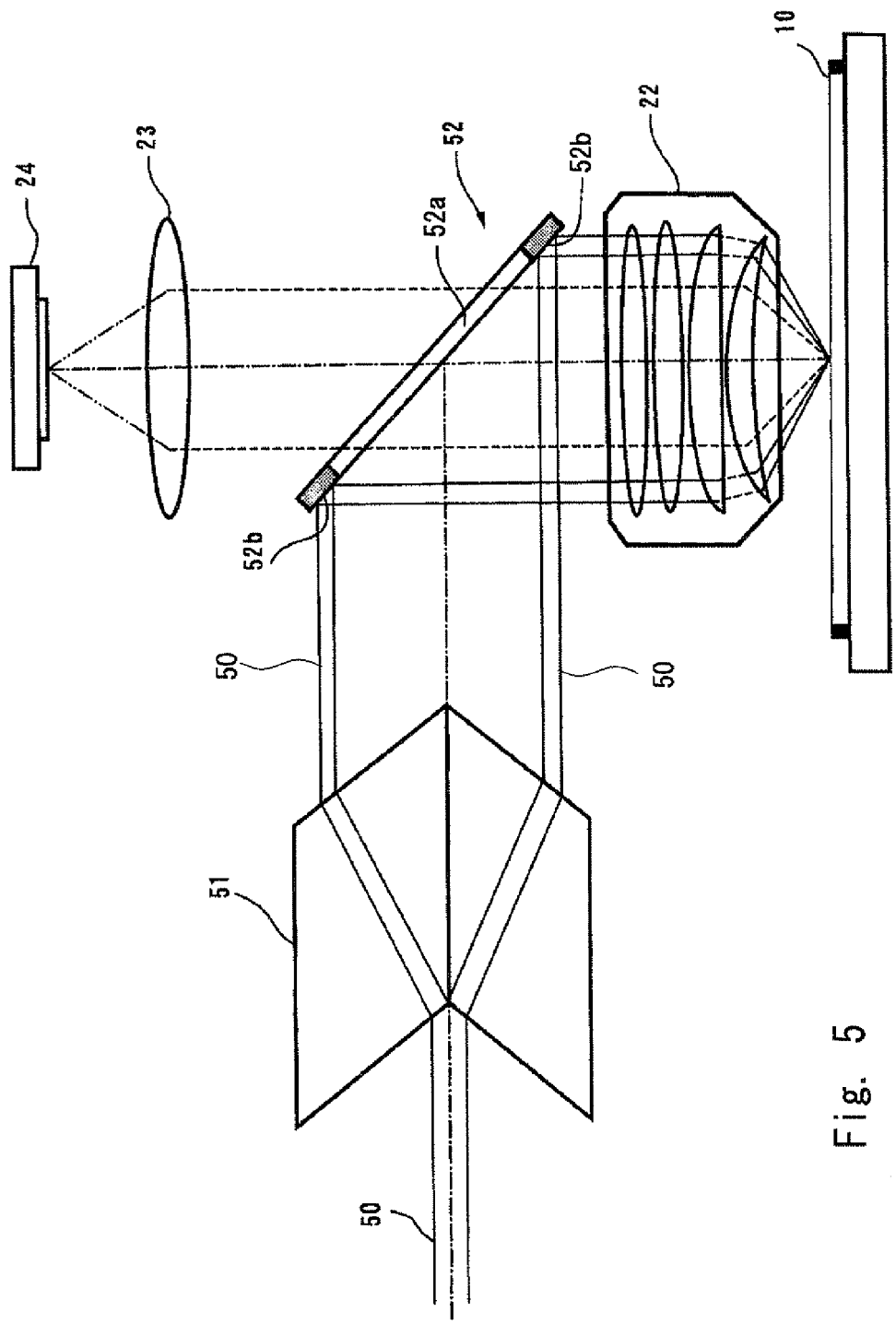
FIG. 5 is a drawing illustrating another modification of the illumination optical system.

FIG. 5 illustrates another modification of the illumination optical system. In this example, the pellicle film is scanned by using a ring-shaped converging illuminating beam. The illumination light source generates a parallel illuminating beam 50 having a circular cross section. The illuminating beam 50 enters a center portion on a depressed side of an axicon meniscus lens (axicon lens) 51. The axicon meniscus lens 51 converts the incident illuminating beam 50 into a parallel illuminating beam having a ring-shaped cross section. The ring-shaped illuminating beam 50 enters a mirror 52. The mirror 52 has an opening 52a and a reflecting surface 52b. The opening 52a is formed at a center portion of the mirror 52. The reflecting surface 52b is formed into a ring shape in the periphery of the opening 52a. The mirror 52 functions to couple the illuminating beam 50 to an optical path of the object lens 22. The ring-shaped illuminating beam incident on the mirror 52 reflects from the reflecting surface 52b, and enters the object lens 22. In this modification, a high NA object lens may be used as the object lens 22. An NA of the high NA object lens 22 is preferably on the order of 0.95. In this case, the maximum light receiving angle of the object lens 22 is 72°. Therefore, in the case of causing a ring-shaped illuminating light having a half angle 5° to enter, a configuration is to be made so that only the scattering light having a light receiving angle from the pellicle film surface of 30° or smaller (that is, on the order of NA≤0.5) can enter the first light detector 24. In this configuration, even though the ring-shaped illuminating beam 50 passes through the object lens 22, inspection is achieved with a dark-field illumination. The object lens 22 functions as a converging optical system that converges the incident ring-shaped illuminating beam 50. Therefore, the ring-shaped illuminating beam 50 forms a spot-like illuminating point by being collected on the pellicle film by the object lens 22.

The foreign substances present on the pellicle film are illuminated by an angular direction of 360° and generates the scattering light. The generated scattering light is collected by the object lens 22, and passes through the opening 52a of the mirror 52. The scattering light passed through the opening 52a of the mirror 52 enters the first light detector 24 via the imaging lens 23. This example is characterized in that an inspection region on the pellicle film surface may be irradiated with an illuminating light from an entire circumference of 360°. Therefore, the amounts of the scattering light generated from the same foreign substances are almost constant irrespective of the direction that the pellicle film inclines. Accordingly, stable detection sensitiveness is obtained.

Figure 6:
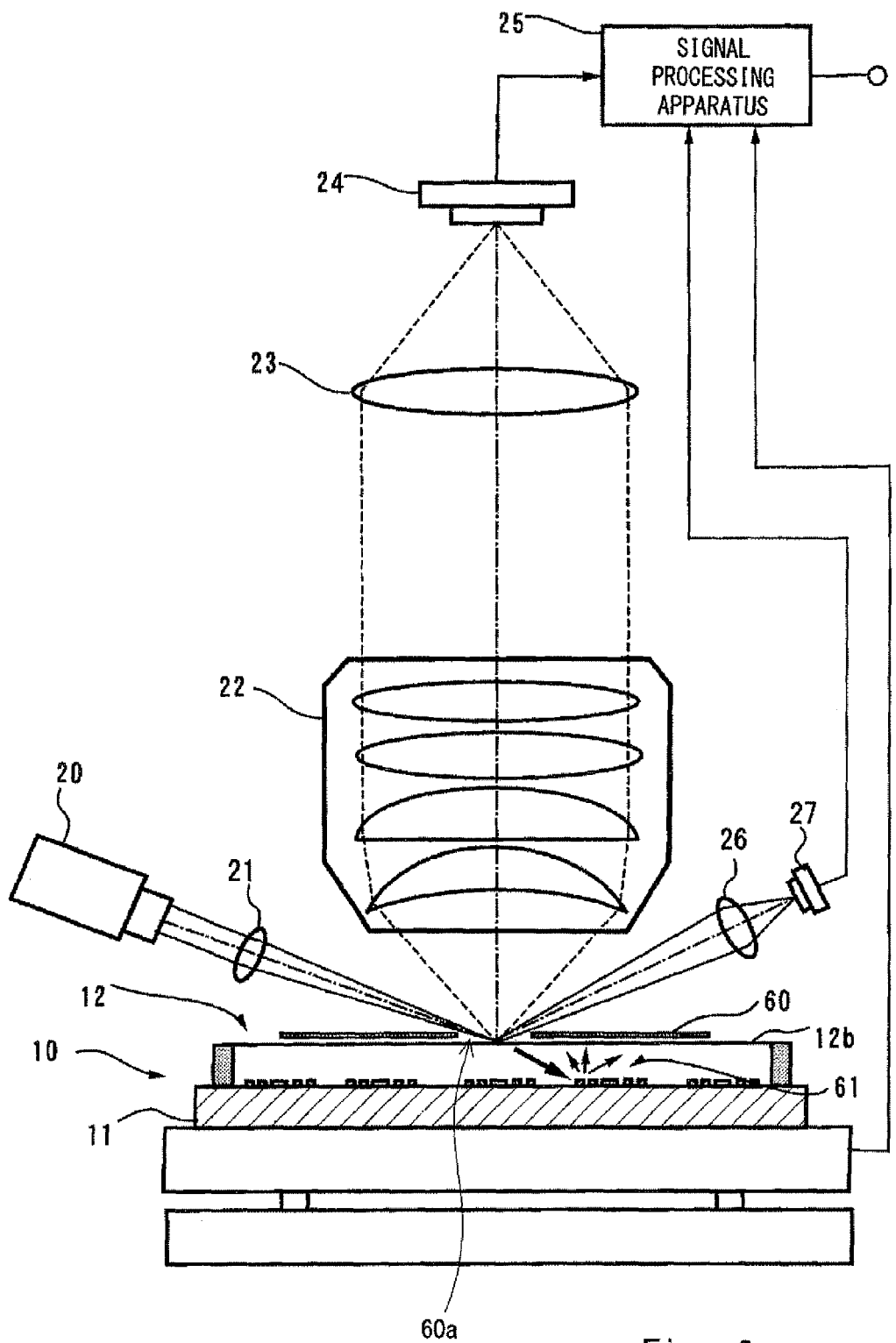
FIG. 6 is a drawing illustrating a modification of the pellicle inspection apparatus of the invention.

FIG. 6 illustrates another modification of the pellicle inspection apparatus of this embodiment. In FIG. 6, the same components as the components used in FIG. 1 are denoted by the same reference signs for description. In this example, a light-shielding device 60 having a pin hole-shaped or a slit-shaped opening 60a is arranged between the object lens 22 and the pellicle 12. The illuminating beam outgoing from the illuminating light source 20 is projected toward the pellicle film 12b via the opening 60a of the light-shielding device 60. The scattering light generated from the foreign substances present on the pellicle film 12b enters the object lens 22 via the opening 60a. The object lens 22 collects the scattering light. In the case where the illuminating beam within a wavelength band which transmits through the pellicle film 12b is used, the illuminating beam transmits through the pellicle film 12b, and enters the mask pattern of the EUV mask 11. Consequently, unnecessary scattering light 61 is generated from the mask pattern. However, even though the unnecessary scattering light 61 is generated, the scattering light 61 is shielded by the light-shielding device 60. Therefore, a problem that the unnecessary scattering light 61 enters the object lens 22 does not occur. In this example, illumination light of various wavelength band such as visible light or infrared ray may be used. For example, a light source such as a semiconductor laser may be used and hence an advantage of increasing the range of choice of the illuminating light source 20 is achieved.

Figure 7:
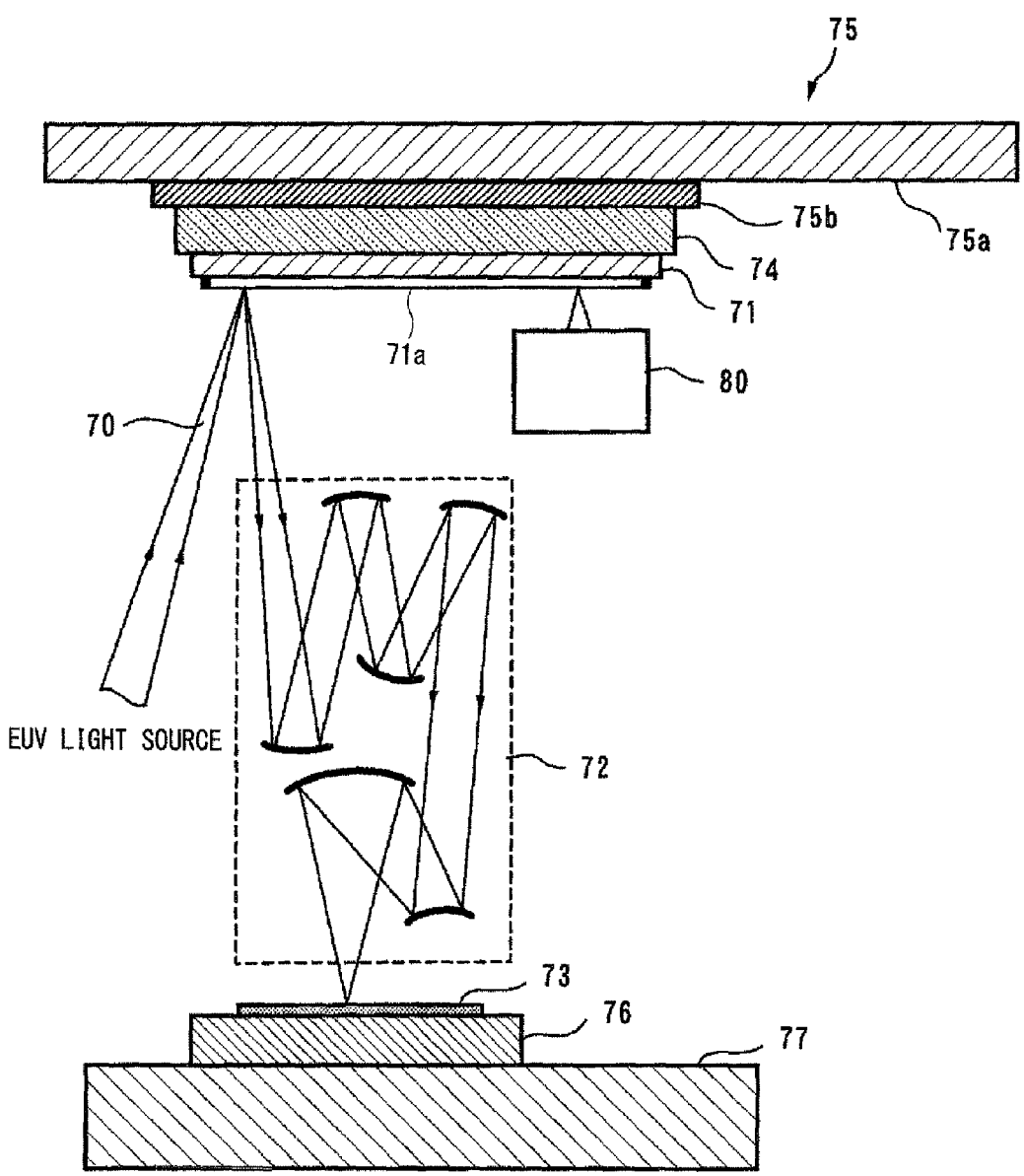
FIG. 7 is a drawing illustrating a modification of the pellicle inspection apparatus of the invention.
Figure 8:
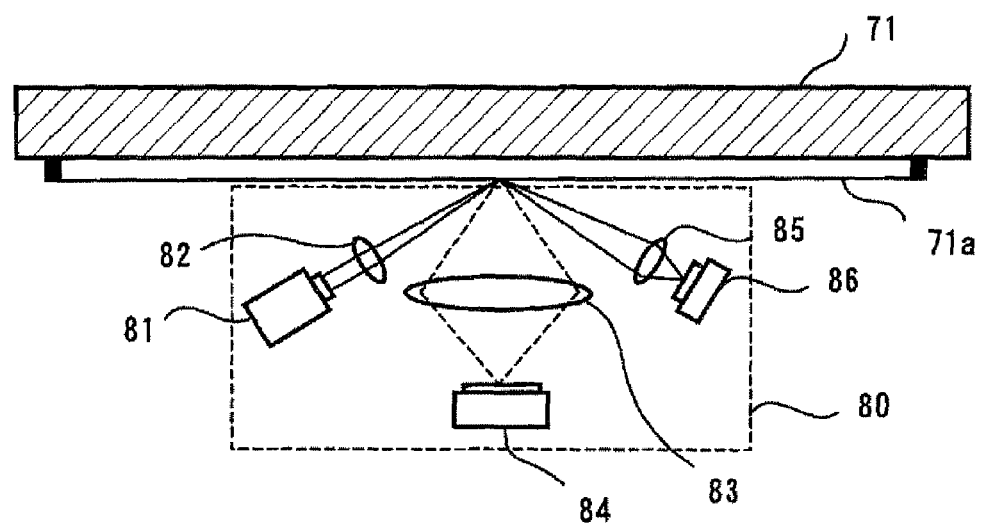
FIG. 8 is a drawing illustrating an example of a pellicle inspection apparatus 80 illustrated in FIG. 7.

FIG. 7 and FIG. 8 illustrate another modification of the pellicle inspection apparatus of the invention. In this example, an inspection in situ in which the pellicle inspection apparatus is mounted in an exposure apparatus will be described. EUV light 70 for exposure outgoing from an EUV light source (not shown) is projected toward an EUV mask 71 with a pellicle. A reflecting beam including the pattern information outgoing from the EUV mask 71 is imaged on a wafer 73 via a projection optical system 72. The projection optical system 72 includes, for example, six aspherical mirrors. The projection optical system 72 reductively projects an image of the pattern of the EUV mask 71 on the wafer 73 in ¼ size, where pattern exposure is performed.

The EUV mask 71 is held by an electrostatic chuck 74. The electrostatic chuck 74 is mounted on a reticle stage 75. The reticle stage 75 includes a fixed stage 75a and a movable stage 75b. The movable stage 75b is configured to be movable along the X-direction (the direction in a paper plane). In contrast, the wafer 73 is arranged on a wafer table 76. The wafer table 76 is coupled to a wafer stage 77, and is moved in the X-direction synchronously with the reticle stage 75. The wafer table 76 is configured to be movable in the Y-direction (the direction orthogonal to the paper plane). An image of the pattern of the EUV mask 71 is projected on the wafer 73 via the projection optical system 72. In this configuration, pattern exposure is performed over the entire surface of the wafer 73.

In this example, a pellicle inspection apparatus 80 is arranged so as to oppose the EUV mask 71. The EUV mask 71 is capable of moving in a state of being held by the electrostatic chuck 74, and hence is moved rightward along the paper plane to a position opposing the pellicle inspection apparatus 80. The entire surface of a pellicle film 71a may be inspected by using the illuminating beam projected from the pellicle inspection apparatus 80.

FIG. 8 is a drawing illustrating an example of the pellicle inspection apparatus 80 mounted on the exposure apparatus. As an illuminating light source that generates the illuminating beam, a semiconductor laser 81 that generates ultraviolet light having a wavelength of 365 nm is used. An illuminating beam having a wavelength of 365 nm does not substantially transmit through a monocrystalline silicon film having a thickness of 50 nm. Therefore, generation of the unnecessary scattering light from the mask pattern is prevented. A light collection lens 82 collects the illuminating beam onto the pellicle film 71a. When the foreign substances such as particles are present on the pellicle film 71a, the scattering light is generated. The scattering light is collected by an object lens 83, and is detected by a first light detector 84 via a relay lens (not illustrated). The regular reflection light reflected by the pellicle film 71a is collected by a light collection lens 85, and is detected by a second light detector 86. An optical element of the pellicle inspection apparatus 80 is unitized on the stage, and may be configured as a single unitized pellicle inspection apparatus 80. In this modification, the entire surface of the pellicle film 71a may be two-dimensionally scanned by the illuminating beam by using a two-dimensional movement of the reticle stage 75. As a matter of course, it is also possible to arrange the pellicle inspection apparatus 80 on a traverse rail to set to allow a movement in the X-direction and two-dimensionally scan by using the movement of the reticle stage 75 in the Y-direction. In this modification as well, an angle of incident of the illuminating beam with respect to the pellicle film 71a is set so as to satisfy Expression (1) described above.

Figure 9A:
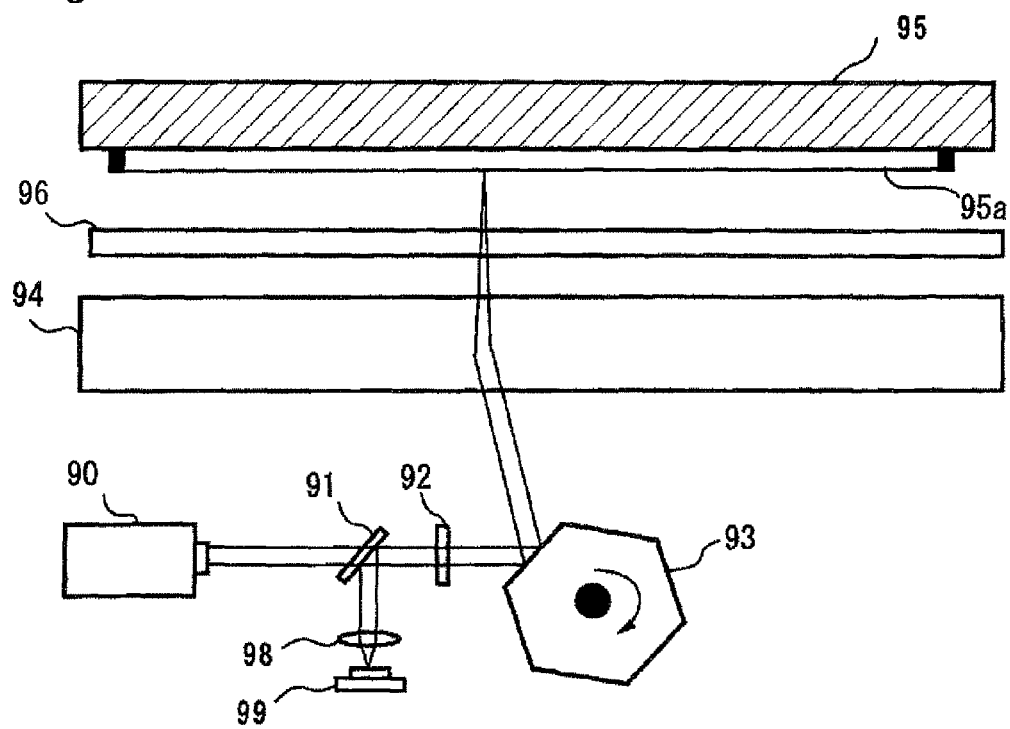
FIG. 9A is a drawing illustrating another modification of the pellicle inspection apparatus in situ.
Figure 9B:
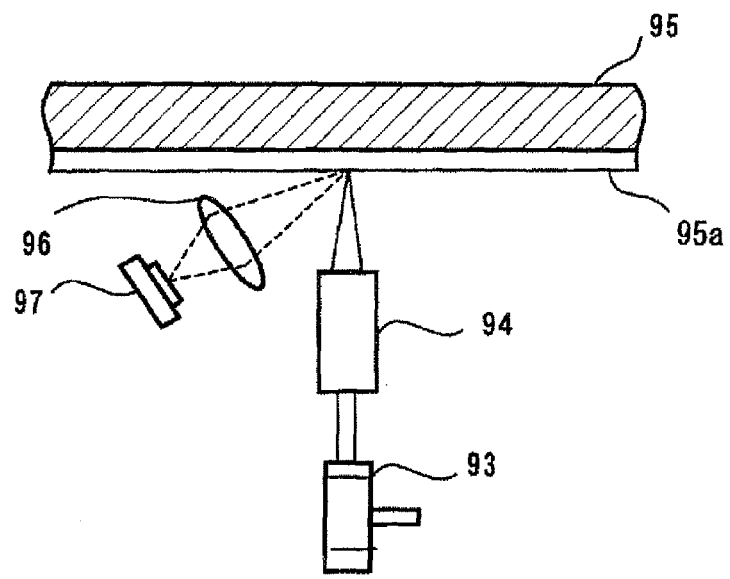
FIG. 9B is a drawing illustrating another modification of the pellicle inspection apparatus in situ.

FIG. 9A and FIG. 9B illustrate another example of the EUV pellicle inspection apparatus in situ in the EUV exposure apparatus. FIG. 9A illustrates the pellicle inspection apparatus with a primary scanning direction in a direction of the paper plane. FIG. 9B illustrates the pellicle inspection apparatus with the primary scanning direction orthogonal to the paper plane. In this example, a solid-state laser that generates ultraviolet light having a wavelength of 355 nm is used as an illumination light source 90. An illuminating beam outgoing from the illumination light source 90 transmits through a polarizing beam splitter 91 and a quarter wave plate 92 and enters a polygon mirror 93. The polygon mirror 93 deflects the illuminating beam at a high speed to a direction parallel to the paper plane of the FIG. 9A. An illuminating beam outgoing from the polygon mirror 93 is collected on a pellicle film 95a of a photomask 95 provided with a pellicle via an f–θ lens 94. The illuminating beam enters the pellicle film 95a in a direction perpendicular thereto. In the case where the foreign substances are present in an area where the illuminating light is collected on the pellicle film 95a, scattering light is generated. The generated scattering light is received by a linear sensor 97 via a light collection lens 96. The linear sensor 97 as the first light detector includes pixels arrayed in a row in the primary scanning direction and has an elongated shape. The light collection lens 96 is arranged between the f–θ lens 94 and the pellicle film 95a. For example, a cylindrical lens may be used as the light collection lens 96.

The regular reflection light outgoing from the pellicle film 95a returns reversely along the same optical path as that of illuminating light. Therefore, the regular reflection light passes through the f–θ lens 94, and passes through the polygon mirror 93 and the quarter wave plate 92, and enters the polarizing beam splitter 91. The regular reflection light is reflected from the polarizing beam splitter 91, and is received by a light detector 99 via a light collection lens 98. In the case where the contamination is present on the pellicle film 95a, the intensity of the regular reflection light is lowered. Therefore, by using an output signal from the light detector 99, the contamination defect may be detected. In other words, the output signal from the light detector 99 as the second light detector is compared with the threshold value.

According to the above embodiments, a pellicle inspection apparatus capable of inspecting the pellicle suitably is provided.

In this example, the entire surface of the pellicle film may be two-dimensionally scanned by primary scanning with a scanning system including the polygon mirror 93 and the f–θ lens 94 and a movement in a direction orthogonal to the primary scanning direction of a mask stage that supports the photomask 95 provided with a pellicle. The EUV pellicle inspection apparatus is characterized in that scanning may be performed at a quite high speed because the high-speed deflection by the polygon mirror 93 is used. Therefore, an inspection time is significantly reduced.

In the pellicle inspection apparatus of the respective embodiments described above, the incident angle of the illuminating beam is set adequately, and the scattering light detection and the regular reflection light detection are executed in parallel, the pellicle inspection apparatus in which the problems unique to the pellicle inspection of the EUV mask are solved may be realized.

In particular, the defect inspection using the scattering light and the defect inspection using the regular reflection light are performed in parallel, and the foreign substances and the contaminations are classified by using the defect classifying device in the signal processing apparatus. Therefore, the foreign substances such as particles and the contamination having a thin film form may be detected individually, so that the defects generated by different causes can be detected adequately.

The signal processing apparatus 25 is a personal computer, circuitry, a processor or the like and executes the process as described above. The units of the signal processing apparatus 25 may each be configured, as hardware, by a CPU, memory, or a circuit in another form, or, as software, by a program loaded into a memory. Accordingly, these function blocks may be realized in a form of hardware, software, or a combination of the two as commonly understood by persons having ordinary skill in the art, and are not be limited to any specific form. Further, it is to be noted that the elements having substantially the same features depicted in the drawings will be assigned the same reference numerals, and the description thereof will not be repeated as appropriate.

Further, the program may be stored by using various types of non-transitory computer readable medium, and supplied to computers. The non-transitory computer readable medium includes various types of tangible storage medium. Examples of the non-transitory computer readable medium include a magnetic recording medium (such as a flexible disk, a magnetic tape, and a hard disk drive), a magneto-optic recording medium (such as a magneto-optic disk), a CD-ROM (Read Only Memory), a CD-R, and a CD-R/W, and a semiconductor memory (such as a mask ROM, a PROM (Programmable ROM), an EPROM (Erasable PROM), a flash ROM, and a RAM (Random Access Memory)). Further, the program may be supplied to computers by using various types of transitory computer readable media. Examples of the transitory computer readable media include an electrical signal, an optical signal, and an electromagnetic wave. The transitory computer readable media may be used to supply programs to computer through a wire communication path such as an electrical wire and an optical fiber, or wireless communication path.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A pellicle inspection apparatus that inspects a pellicle film of a mask provided with a pellicle and used in EUV lithography, the pellicle inspection apparatus comprising:
an illumination optical system that projects a converging illuminating beam toward the pellicle film;
a light collection optical system including an object lens having an optical axis substantially orthogonal to the pellicle film and that collects scattering light outgoing from a foreign substance present on the pellicle film; and
a detection system that detects the scattering light collected by the light collection optical system,
wherein an incident angle θ2 of the illuminating beam with respect to the pellicle film satisfies Expression (1)

$$θ2−θ0>θ1+23° \quad (1)$$

where θ0 is a collecting angle (half angle) of the illuminating beam, and θ1 is a maximum light-receiving angle (half angle) of the object lens.

2. The pellicle inspection apparatus according to claim 1, wherein the illumination optical system projects a plurality of illuminating beams arrayed in an annular shape about an illuminating point formed on the pellicle film, and illuminates the illuminating point on the pellicle film from angular directions different from each other.

3. The pellicle inspection apparatus according to claim 1, wherein the illumination optical system projects a ring-shaped converging illuminating beam when viewing in a direction of an optical axis of the object lens.

4. The pellicle inspection apparatus according to claim 3, wherein
the illumination optical system includes:
an illuminating light source that generates a light beam;
an axicon lens that converts the light beam outgoing from the illuminating light source into a ring-shaped illuminating beam; and
an optical component that couples the ring-shaped illuminating beam outgoing from the axicon lens with an optical path of the object lens, and
the illuminating beam is projected toward the pellicle film via the object lens as the ring-shaped converging beam.

5. The pellicle inspection apparatus according to claim 1, wherein
the pellicle film is formed of a silicon film, and
the illuminating beam is formed of an illuminating light in an ultraviolet region, that substantially does not transmit through the silicon film.

6. The pellicle inspection apparatus according to claim 5, wherein the illumination optical system includes a solid-state laser that generates a third harmonic wave of a YAG laser, and generates an illuminating beam having a wavelength of approximately 355 nm.

7. The pellicle inspection apparatus according to claim 1 comprising: a light-shielding device having an opening, the light-shielding device being provided between the pellicle film and the object lens, wherein
the illuminating beam is projected on the pellicle film via the opening of the light-shielding device, and
the scattering light outgoing from a foreign substance present on the pellicle film enters the object lens via the opening.

8. The pellicle inspection apparatus according to claim 7, wherein the scattering light generated from a patterned portion of the mask by the illuminating beam transmitting through the pellicle film is shielded by the light-shielding device.

9. A pellicle inspection apparatus that inspects a pellicle film of a mask provided with a pellicle and used in EUV lithography, the pellicle inspection apparatus comprising:
an illumination optical system that projects a converging illuminating beam toward the pellicle film;
a light collection optical system including an object lens having an optical axis substantially orthogonal to the pellicle film and that collects scattering light outgoing from a foreign substance present on the pellicle film;
a first light detecting device that detects the scattering light collected by the light collection optical system;
a second light detecting device that detects reflection light outgoing from the pellicle film; and
a signal processing apparatus that detects a foreign substance defect present on the pellicle film and a contamination defect formed into a thin film shape on a surface of the pellicle film on the basis of an output signal from the first and second light detecting devices,
wherein an incident angle θ2 with reference to an optical axis of the object lens with respect to the pellicle film of the illuminating beam satisfies Expression (1):

$$θ2−θ0>θ1+23° \quad (1)$$

where θ0 is a collecting angle (half angle) of the illuminating beam, and θ1 is a maximum light-receiving angle (half angle) of the object lens.

10. The pellicle inspection apparatus according to claim 9, wherein
the signal processing apparatus includes: a first defect detecting device that detects a defect from an output signal output from the first light detecting device; a second defect detecting device that detects a defect from an output signal output from the second light detecting device; and a defect classifying device that receives output signals from the first and second defect detecting devices and classifies the detected defect into a foreign substance defect and a contamination defect, and the defect classifying device classifies the detected defect as the foreign substance defect in the case where the defect detection signals are output simultaneously from the first and second defect detecting devices, and if the defect detection signal is output only from the second defect detecting device, classifies the detected defect as the contamination defect.

11. A pellicle inspection apparatus that inspects a pellicle film of a mask provided with a pellicle and used in EUV lithography, the pellicle inspection apparatus comprising:
an illumination optical system that projects a converging illuminating beam toward the pellicle film at a predetermined incident angle;
a light collection optical system including an object lens having an optical axis substantially orthogonal to the pellicle film and that collects scattering light outgoing from a foreign substance present on the pellicle film;

a light-shielding device arranged between the pellicle film and the object lens and having an opening;

a first light detecting device that detects the scattering light collected by the light collection optical system;

a second light detecting device that detects regular reflection light outgoing from the pellicle film; and a signal processing apparatus that detects a foreign substance defect present on the pellicle film and a contamination defect formed into a thin film shape on a surface of the pellicle film on the basis of an output signal output from the first and second light detecting devices, wherein the illuminating beam is projected to the pellicle film via the opening of the light-shielding device, the scattering light outgoing from the foreign substance present on the pellicle film enters the object lens via the opening, and the regular reflection light outgoing from the pellicle film is received by the second light detecting device via the opening.

12. The pellicle inspection apparatus according to claim 9, wherein the pellicle inspection apparatus is mounted on an EUV exposure apparatus that projects a mask pattern of a mask provided with a pellicle with EUV light on a wafer.

* * * * *